(12) United States Patent
Nishimura et al.

(10) Patent No.: US 7,251,171 B2
(45) Date of Patent: Jul. 31, 2007

(54) SEMICONDUCTOR MEMORY AND SYSTEM APPARATUS

(75) Inventors: Koichi Nishimura, Kawasaki (JP); Shinichi Yamada, Kawasaki (JP); Yukihiro Nomura, Kawasaki (JP)

(73) Assignee: Fujitsu Limited., Kawasaki (JP)

( * ) Notice: Subject to any disclaimer, the term of this patent is extended or adjusted under 35 U.S.C. 154(b) by 100 days.

(21) Appl. No.: 11/167,318

(22) Filed: Jun. 28, 2005

(65) Prior Publication Data

US 2006/0203576 A1    Sep. 14, 2006

(30) Foreign Application Priority Data

Mar. 10, 2005   (JP)   ............................. 2005-067029

(51) Int. Cl.
G11C 7/00 (2006.01)
G11C 7/10 (2006.01)
G11C 8/00 (2006.01)

(52) U.S. Cl. ................. 365/191; 365/194; 365/189.02; 365/233

(58) Field of Classification Search ................ 365/191, 365/194, 189.02, 233
See application file for complete search history.

(56) References Cited

U.S. PATENT DOCUMENTS

| | | | |
|---|---|---|---|
| 5,905,690 A | 5/1999 | Sakurai et al. | |
| 2004/0158700 A1* | 8/2004 | Maeda | 713/1 |
| 2004/0268136 A1* | 12/2004 | Mitsuishi | 713/189 |

FOREIGN PATENT DOCUMENTS

JP   11-149771   6/1999

* cited by examiner

*Primary Examiner*—Amir Zarabian
*Assistant Examiner*—Ly Duy Pham
(74) *Attorney, Agent, or Firm*—Arent Fox LLP

(57) ABSTRACT

A register part of a mode register has a plurality of operation setting parts in which plural types of operating specifications are respectively set to operate the semiconductor memory. The mode register outputs a soft reset signal when at least a value of one-bit of the register part represents a reset state. A reset signal generator outputs a reset signal for resetting an internal circuit in response to the soft reset signal. In the present invention, a system that controls the semiconductor memory is required to necessarily assign a predetermined bit with a setting command of the mode register in order to generate the soft reset signal. Accordingly, it is possible to reliably reset the internal circuit by external control.

17 Claims, 8 Drawing Sheets

| AD | function | KEY | explanation |
|---|---|---|---|
| AD18-16 | burst length | 000-001<br>010<br>011<br>100-110<br>111 | reserve<br>8 words*<br>16 words<br>reserve<br>continuous |
| AD15 | operation mode | 0<br>1 | synchronous mode*<br>asynchronous mode |
| AD14-12 | read latency | 000<br>001<br>010<br>011<br>100<br>101<br>110-111 | reserve<br>3 clocks*<br>4 clocks<br>5 clocks<br>6 clocks<br>7 clocks<br>reserve |
| AD11 | soft reset | 0<br>1 | default*<br>reset |

Fig. 2

| AD | function | KEY | explanation |
|---|---|---|---|
| A18-16 | burst length | 000-001<br>010<br>011<br>100-110<br>111 | reserve<br>8 words*<br>1 6 words<br>reserve<br>continuous |
| A15 | operation mode | 0<br>1 | synchronous mode*<br>asynchronous mode |
| A14-12 | read latency | 000<br>001<br>010<br>011<br>100<br>101<br>110-111 | reserve<br>3 clocks*<br>4 clocks<br>5 clocks<br>6 clocks<br>7 clocks<br>reserve |
| A18-16, A15 | soft reset | 000, 0 | reset |

Fig. 6

SEMICONDUCTOR MEMORY AND SYSTEM APPARATUS

CROSS-REFERENCE TO RELATED APPLICATION

This application is based upon and claims the benefit of priority from Japanese Patent Application No. 2005-067029, filed on Mar. 10, 2005, the entire contents of which are incorporated herein by reference.

BACKGROUND OF THE INVENTION

1. Field of the Invention

The present invention relates to a semiconductor memory having a mode register that sets an operation mode and a system apparatus having the semiconductor memory mounted thereon.

2. Description of the Related Art

In general, a semiconductor memory such as a DRAM has a power-on reset circuit. An internal circuit such as a latch is initialized by a power-on reset signal generated when a power supply voltage is low. A method of resetting a test mode register in response to both the power-on reset signal and an initialize command (precharge command) supplied from outside is disclosed in Japanese Unexamined Patent Application Publication No. 11-149771.

In a case in which an internal circuit such as the test mode register is directly reset by the initialize command supplied from outside, when a typical write command is recognized incorrectly as an initialize command due to noise and so on, the internal circuit is reset. In addition, when a user employs a command (e.g. a precharge command) used to operate a semiconductor memory for the initialize command, a chance increases that the user (system) supplies the initialize command to the semiconductor memory incorrectly, which causes a problem in that an unexpected command may reset the internal circuit.

SUMMARY OF THE INVENTION

The present invention is designed to solve the above problems, and it is an object of the invention to ensure that an internal circuit of a semiconductor memory is reset by an external control.

According to a first aspect of the present invention, a register part of a mode register includes a plurality of operation setting parts in which plural types of operating specifications are respectively set to operate the semiconductor memory. An operation control circuit accesses the memory cell array according to the operating specifications set in the mode register. A command control circuit decodes an external command supplied through a command terminal. The command control circuit changes a value of the register part when the external command represents a setting command that sets the register part of the mode register. The mode register outputs a soft reset signal when at least a value of one-bit of the register part represents a reset state. A reset signal generator outputs a reset signal for resetting an internal circuit in response to the soft reset signal. In the present invention, a system that controls the semiconductor memory is required to necessarily assign a predetermined bit with a setting command of the mode register in order to generate the soft reset signal. Accordingly, it is possible to reliably reset the internal circuit by the external control.

According to a second aspect of the present invention, a system apparatus includes a controller and a plurality of semiconductor memories accessed by the controller. One of the semiconductor memories has a reset output terminal that outputs a soft reset signal to outside of the semiconductor memory, so that it has characteristics of the semiconductor memory according to the first aspect of the invention. Accordingly, by supplying a setting command to one semiconductor memory, it is possible to reset internal circuits of other semiconductor memories as well as an internal circuit of the semiconductor memory. As a result, a reset of the system can be simply and easily controlled.

In a preferred embodiment of the first and second aspects of the present invention, a pulse generator generates a reset pulse signal having a pulse synchronized with a transition edge of the soft reset signal. The reset signal generator receives the reset pulse signal as the soft reset signal. By generating a reset signal using a pulse signal, it is possible to easily set a reset period of the internal circuit by the reset signal.

In a preferred embodiment of the first and second aspects of the present invention, the mode register initializes the register part in response to the reset signal in order to stop an output of the soft reset signal. In other words, the soft reset signal is output during only a predetermined period in response to a setting command. To release the reset state of the internal circuit, a new external command to stop outputting the soft reset signal is not required. Accordingly, it is possible to control a system simply and easily.

In a preferred embodiment of the first and second aspects of the present invention, a delay circuit delays the reset signal to generate a delayed reset signal. The mode register initializes the register part in response to the delayed reset signal in order to stop an output of the soft reset signal. For this reason, an output period of the soft reset signal can be easily set by a delayed time of the delay circuit, so that it is possible to reliably initialize the internal circuit. Moreover, as described above, since the mode register itself is initialized by the setting command, it is possible to control the system simply and easily.

In a preferred embodiment of the first and second aspects of the present invention, the register part of the mode register is set according to at least one of external address signals and external data signals supplied with the setting command. The soft reset signal is not output just by supplying an external command. Accordingly, it can be prevented that the setting command is recognized incorrectly due to noise or the like to thereby initialize the internal circuit incorrectly.

In a preferred embodiment of the first and second aspects of the present invention, a power-on reset part of the reset signal generator generates a power-on reset signal when an external power supply voltage is lower than a predetermined value. A synthesis part of the reset signal generator outputs the reset signal in response to the power-on reset signal and the soft reset signal. Accordingly, it is possible to supply the soft reset signal to the internal circuit using a supply path of the power-on reset signal. Thereby, the wiring area of a signal line of the reset signal can be reduced, and as a result, the chip size of the semiconductor memory can be reduced.

In a preferred embodiment of the first and second aspects of the present invention, a reset setting part whose reset state is set in response to the setting command is formed in the register part of the mode register, independently of the operation setting part. By setting a dedicated bit for outputting the soft reset signal, a system can easily control a reset of the semiconductor memory.

In a preferred embodiment of the first and second aspects of the present invention, the register part of the mode register is set to the reset state, when a combination of operating specifications set by each of the operation setting parts is a restricted combination. By assigning a bit for outputting the soft reset signal using an existing bit, a circuit structure of the mode register can be made to be small, and accordingly, the chip size of the semiconductor memory can be reduced.

In a preferred embodiment of the first and second aspects of the present invention, the soft reset signal is output to outside of the semiconductor memory through a reset output terminal in order to reset other semiconductor memories mounted on a system apparatus with the semiconductor memory. Accordingly, by supplying a setting command to one semiconductor memory, other semiconductor memories can also be reset, so that a reset of the system can be simply and easily controlled.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2 is a view illustrating details of a mode register shown in FIG. 1;

FIG. 6 is a view illustrating details of a mode register shown in FIG. 5;

DESCRIPTION OF THE PREFERRED EMBODIMENTS

Figure 1:
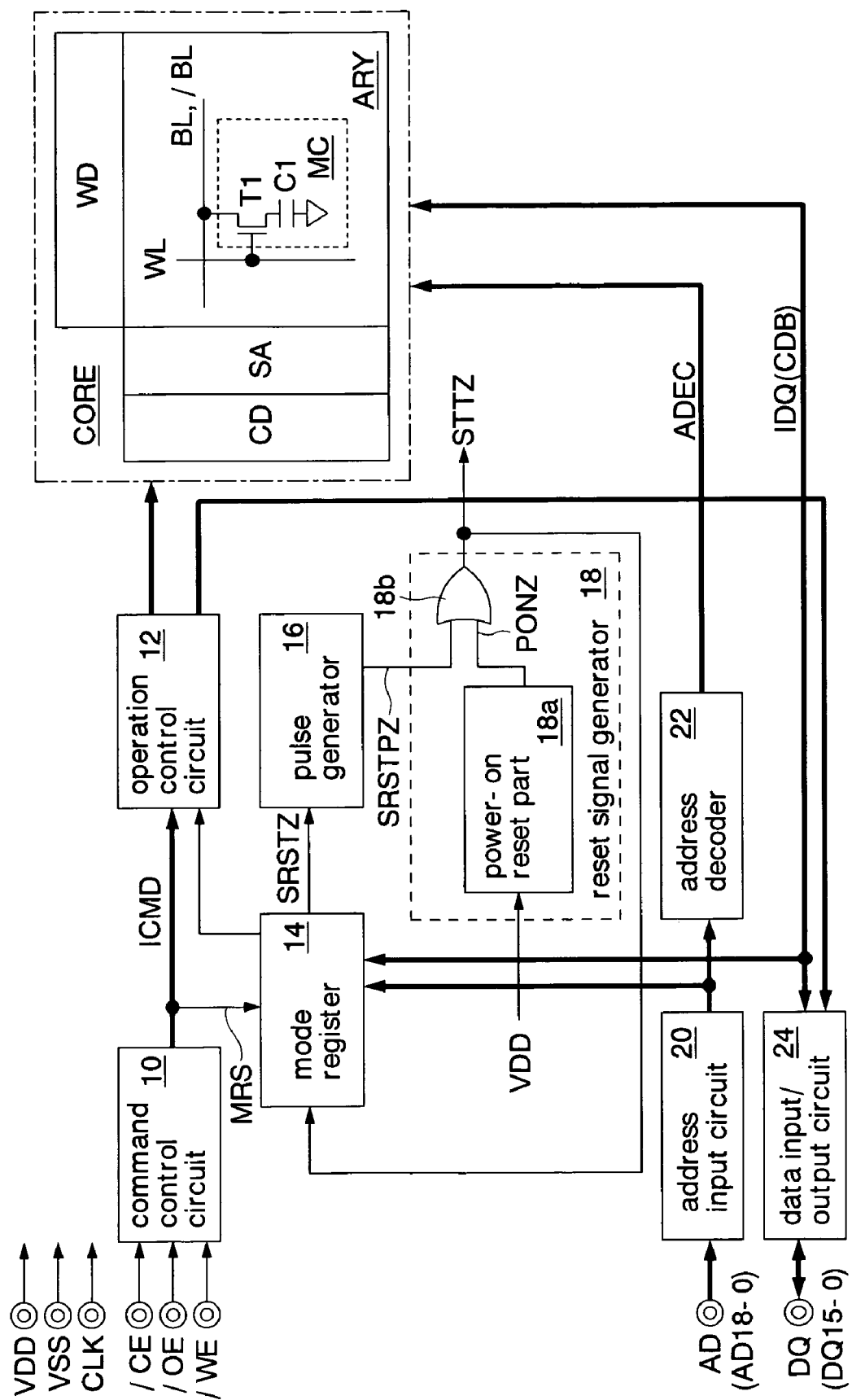
FIG. 1 is a block diagram illustrating a semiconductor memory according to a first embodiment of the present invention.

Preferred embodiments of the present invention will now be described with reference to the drawings. An external terminal is shown in a double circle in the drawings. A signal line indicated by a bold line is composed of a plurality of lines. Further, a part of a block connected to the bold line is composed of a plurality of circuits. A signal suffixed with 'Z' represents a positive logic, while a signal prefixed with '/' represents a negative logic. A signal line along which signals are transferred is shown in the same reference number as a signal name.

FIG. 1 illustrates a semiconductor memory according to a first embodiment of the present invention. The semiconductor memory is formed as, for example, a fast cycle RAM (FCRAM) using a CMOS process technology. The FCRAM, which has a memory core of a DRAM, is a type of pseudo SRAM having an SRAM interface. The FCRAM has operation modes including a synchronous operation mode that performs a burst operation in synchronization with an external clock CLK, in addition to an asynchronous operation mode such as the SRAM that operates asynchronous to a clock. The FCRAM includes a command control circuit 10, an operation control circuit 12, a mode register 14, a pulse generator 16, a reset signal generator 18, an address input circuit 20, an address decoder 22, a data input/output circuit 24, and a memory core CORE.

The command control circuit 10 receives a chip enable signal /CE, an output enable signal /OE, and a write enable signal /WE, as external commands, decodes the received external commands, and outputs the decoded external commands to the operation control circuit 12 as an internal command signal ICMD. Examples of a command represented by the internal command signal ICMD includes a mode register setting command MRS in addition to a read command and a write command. The command control circuit 10 has a function to change the mode register 14 when the external command is the mode register setting command MRS.

The operation control circuit 12 generates a timing signal for read, write, and refresh operations in response to the internal command signal ICMD (read command and write command) supplied from the command control circuit 10 and a refresh command. The timing signal is supplied to the memory core CORE and the data input/output circuit 24 and the like. A generation timing of the timing signal is changed in response to operating specification set by the mode register 14. The operation control circuit 26 includes an arbiter (not shown) that, when the read or write command and the refresh command generated in the FCRAM conflict with each other, determines a priority thereof. The refresh command is periodically generated by a refresh timer (not shown).

The mode register 14 has a plurality of operating specifications for operating the FCRAM. In addition, the mode register 14 has a function to output a soft reset signal SRSTZ for initializing an internal circuit (such as latch that requires initialization) of the FCRAM. The mode register 14 outputs the soft reset signal SRSTZ when a predetermined value is supplied to a predetermined bit of an external address signal AD, together with the mode register setting command MRS. In addition, the mode register 14 stops outputting the soft reset signal SRSTZ in synchronization with a reset signal STTZ. The pulse generator 16 generates a soft reset pulse signal SRSTPZ having a pulse synchronized with a rising edge of the soft reset signal SRSTZ. The mode register setting command MRS is supplied, when a part of the FCRAM circuit mounted on the system does not operate normally due to noise and so on, to force the FCRAM to be reset without stopping supply of the external power supply voltage VDD and then to look into the cause.

In particular, for a semiconductor memory having volatile memory cells (dynamic memory cells or static memory cells), when supply of the power supply voltage VDD is stopped, data retained in the memory cell is lost. In a defect analysis of the semiconductor memory, there are many cases in which good/bad function is determined depending on whether data is retained in the memory cell. Therefore, it is necessary to make defect analysis under the state in which the power supply voltage VDD is supplied.

The reset signal generator 18 includes a power-on reset part 18a and an OR gate 18b (synthesis circuit). The power-on reset part 18a changes a power-on reset signal PONZ into a high level when the external power supply voltage VDD (e.g., 1.8V) is lower than a predetermined voltage. The OR gate 18b outputs the reset signal STTZ in synchronization with the power-on reset signal PONZ and the soft reset pulse signal SRSTPZ. The reset signal STTZ is supplied to the internal circuit (e.g., an address latch of a word decoder WD) such as a latch that requires initialization to set the circuit to an initial state.

A wiring line of the reset signal STTZ uses a conventional wiring line of the power-on reset signal. In other words, using a supply path of the power-on reset signal, the soft reset signal SRSTZ can be supplied to the internal circuit. Therefore, a wiring area of the signal line of the reset signal STTZ can be reduced, and accordingly, the chip size of the FCRAM can be reduced. By the reset signal STTZ, the FCRAM is set to a reset state until the external power supply voltage VDD becomes a predetermined voltage after power-on. Alternatively, the FCRAM is set to the reset state during an output period of the soft reset pulse signal SRSTPZ. By the reset state, the internal circuit of the FCRAM is reset.

The address input circuit 20 receives an external address signal AD (AD18-0) through an address terminal AD, and outputs the received address signal AD to the address decoder 22 and the mode register 14 and so on. The address decoder 22 decodes the external address signal AD, and outputs a decode signal ADEC to the memory core CORE. The FCRAM employs an address non-multiplex method in which a row address signal and a column address signal are received at the same time.

In read operation, the data input/output circuit 24 outputs read data IDQ transferred from the memory core CORE through a common data bus CDB to an external data terminal DQ (DQ15-0). In write operation, the data input/output circuit 24 receives the write data through the external data terminal DQ, and transfers the received external data signal DQ to the memory core CORE through the common data bus CDB. In addition, though not specifically shown, the FCRAM has byte control terminals /UB and /LB for inputting/outputting 16 bits data by 8 bits (1 byte).

The memory core CORE includes a memory cell array ARY, a word decoder WD, a sense amplifier SA, and a column decoder CD. The memory cell array ARY has a plurality of memory cells MC (dynamic memory cell) including a transfer transistor T1 and a capacitor C1, word lines WL connected to a gate of the transfer transistor T1 of each memory cell MC, and bit lines BL (or /BL) connected to a data input/output node of each transfer transistor T1.

The word decoder WD selects one of the word lines WL in response to a row decode signal of the decode signals ADEC. The sense amplifier SA, for example, in reading operation, amplifies the amount of data signal read from the memory cell MC through the bit line BL (or /BL). The memory core CORE has column switches (not shown) each transfers read data read from the bit line BL (or /BL) and amplified by the sense amplifier SA to the common data bus CDB, and transfers write data supplied to the common data bus CDB to the bit line BL (or /BL). The column decoder CD outputs a control signal that controls the column switch in response to a column decode signal of the decode signal ADEC.

FIG. 2 is a view illustrating details of a mode register 14 shown in FIG. 1. The mode register 14 has an 8-bit register part that stores a value of the external address signal AD18-11. The register part has three operation setting parts used to set a burst length (AD18-16), an operation mode (AD15) and a read latency (AD14-12), and a reset setting part (AD11) used to generate the soft reset signal SRSTZ. In general, the external address signal AD supplied to the FCRAM has a large number of bits. To generate the soft reset signal SRSTZ in the mode register 14, a dedicated bit AD11 can be easily allocated. In addition, with the dedicated bit AD11, the system can easily and reliably reset the internal circuit of the FCRAM.

Here, the burst length refers to the number of data successively output or input to the external data terminal DQ in response to one read command or one write command. A continuous mode refers to a mode in which data is successively output or input to the memory cell MC connected to the plurality of word lines WL. The operation mode is set to a synchronous mode, when the burst operation is performed or when the read latency is used. The operation mode is set to an asynchronous mode, when the burst operation is not performed or when the read latency is not used. During the synchronous mode, the read data and the write data are input/output in synchronization with the external clock signal CLK. The read latency refers to the number of clock until the data signal DQ is output to the external data terminal DQ after the read command is received.

The mode register 14 sets the operating specification in response to a value of the address signal AD18-11 (KEY) supplied together with the mode register setting command MRS. Specifically, the operating specification of the FCRAM is determined according to a combination of the operation setting part (operation mode, burst length and read latency). The address bit AD11 refers to a bit for generating the soft reset signal SRSTZ. When the address signal AD11 supplied together with the mode register setting command MRS indicates logic 1 (reset state), the soft reset signal SRSTZ is changed from a low level to a high level.

A system to control the FCRAM is required to change the bit AD11 into logic 1 while supplying the mode register setting command MRS under the state in which the external power supply voltage VDD is supplied, in order to reset the internal circuit of the FCRAM. The soft reset signal SRSTZ is not output just by supplying the external command. For example, even when other operation commands are recognized incorrectly as a mode register setting command MRS due to noise or the like, the soft reset signal SRSTZ is not output. Therefore, the system can reliably reset the internal circuit by the external control only when the reset is necessary, without losing data of the memory cell MC.

After outputting the soft reset signal SRSTZ, the mode register 14 receives the reset signal STTZ to be initialized into a '*' state in the drawing. For this reason, the soft reset signal SRSTZ set to the high level is reset to the low level.

Figure 3:
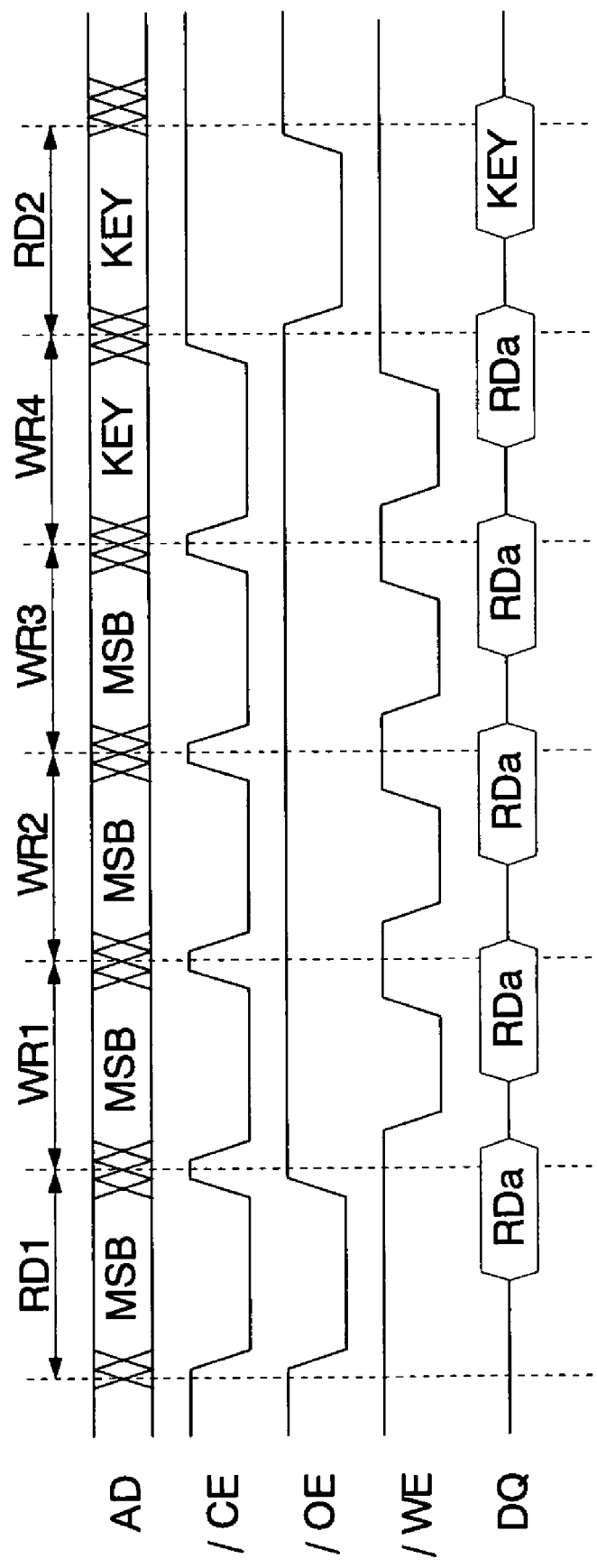
FIG. 3 is a timing chart illustrating a method of setting the mode register shown in FIG. 1.

FIG. 3 illustrates a method of setting the mode register 14 shown in FIG. 1. In the present embodiment, when a read command RD1 (read cycle), a write command WR1-4 (write cycle), and a read command RD2 (read cycle) are successively supplied, the mode register setting command MRS is recognized. The system that initializes the FCRAM sets the address signal AD to an uppermost address MSB (7FFFF in hexadecimal) from the read cycle RD1 to the write cycle WR3, and sets the address signal AD to a value KEY from the write cycle WR4 to the read cycle RD2.

It is necessary for the system to write data RDa read at the first read cycle RD1, in the write cycle WR1-4. In the last read cycle RD2, the value KEY supplied from the data terminal DQ (DQ7-0) to set the mode register 14 is output. The FCRAM outputs the value KEY to the data terminal DQ only when all sequence above, in which the mode register 14 is set, is accurately performed. Further, the mode register 14 is set in response to the value KEY only when the above sequence is accurately performed.

Figure 4:
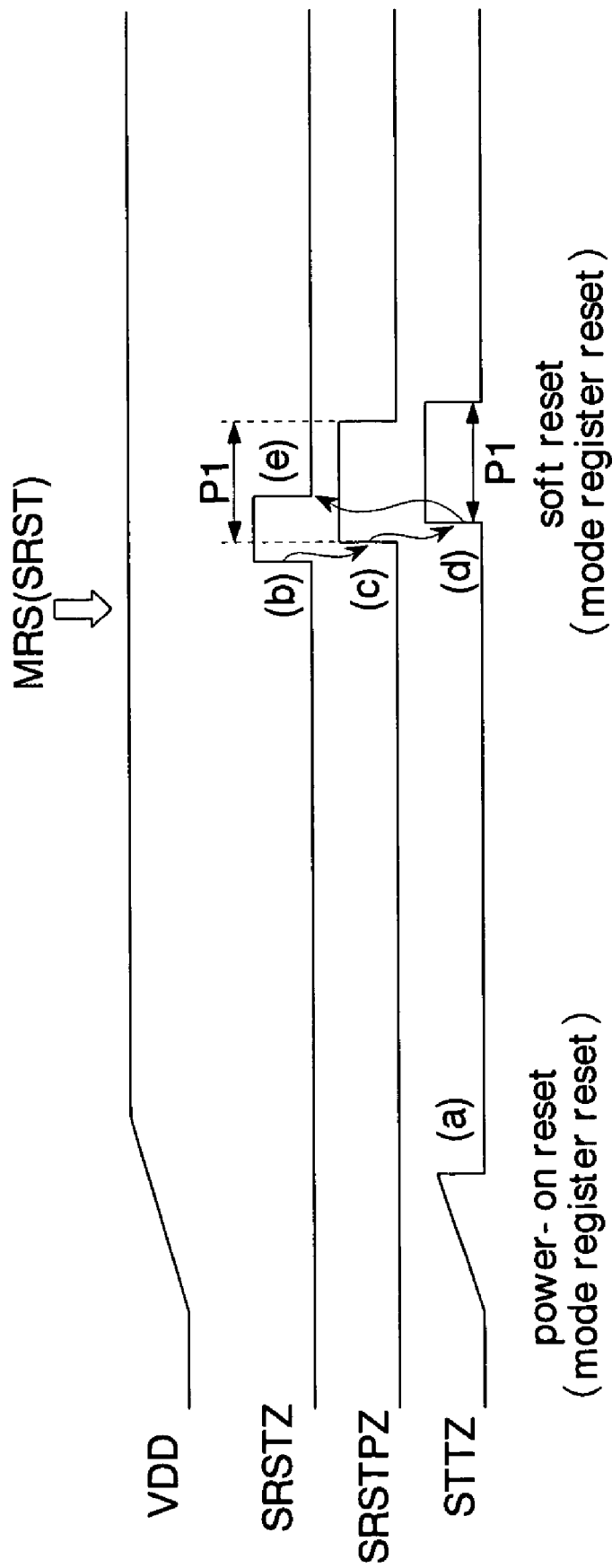
FIG. 4 is a timing chart illustrating operation for generating a reset signal of the semiconductor memory according to the first embodiment.

FIG. 4 illustrates operation for generating a reset signal STTZ First, at a time of power-on of the system, when it is detected that the external power supply voltage VDD is raised up to a predetermined value by the power-on reset part 18*a*, the reset signal generator 18 changes the reset signal STTZ from the high level to the low level ((a) in FIG. 4). The internal circuit that requires initialization is reset during the high level of the reset signal STTZ (power-on reset). The mode register 14 is reset by the reset signal STTZ, and is thus reset to a value indicated by '*' in FIG. 2.

The system to access the FCRAM supplies the mode register setting command MRS to the FCRAM, in order to investigate a state of the FCRAM in which problems occurred during operation. The mode register 14 changes the soft reset signal SRSTZ into a high level in response to the mode register setting command MRS ((b) in FIG. 4). The pulse generator 16 generates the soft reset pulse signal SRSTPZ having a high level period P1, in synchronization with a rising edge of the soft reset signal SRSTZ ((c) in FIG. 4). Here, the pulse generator 16 is designed such that the high level period P1 is generated in which the internal circuit can be reliably initialized. For this reason, the reset period P1 of the internal circuit can be easily set by the soft reset signal SRSTZ in response to logic design of the pulse generator 16.

The reset signal generator 18 outputs a reset signal STTZ having a high level period P1 such as the soft reset pulse signal SRSTPZ ((d) in FIG. 4). The mode register 14 is initialized into a '*' state in FIG. 2 in synchronization with the rising edge of the reset signal STTZ, and thus the soft reset signal SRSTZ is changed into the low level ((e) in FIG. 4). For this reason, to release the reset state of the internal circuit, a new external command to stop outputting the soft reset signal SRSTZ is not required. In addition, when the internal circuit is initialized by the mode register setting command, the mode register 14 itself is also initialized. For this reason, the system that controls the FCRAM is not required to initialize the mode register 14 again after resetting the internal circuit. Therefore, the system can be simply and easily controlled.

Further, according to the first embodiment, only when the bit AD11 can be changed into logic 1 by the mode register setting command MRS, the soft reset signal SRSTZ is generated and thus the internal circuit is reset. Therefore, the system having the FCRAM mounted thereon can reliably reset the FCRAM only when the reset is required.

Figure 5:
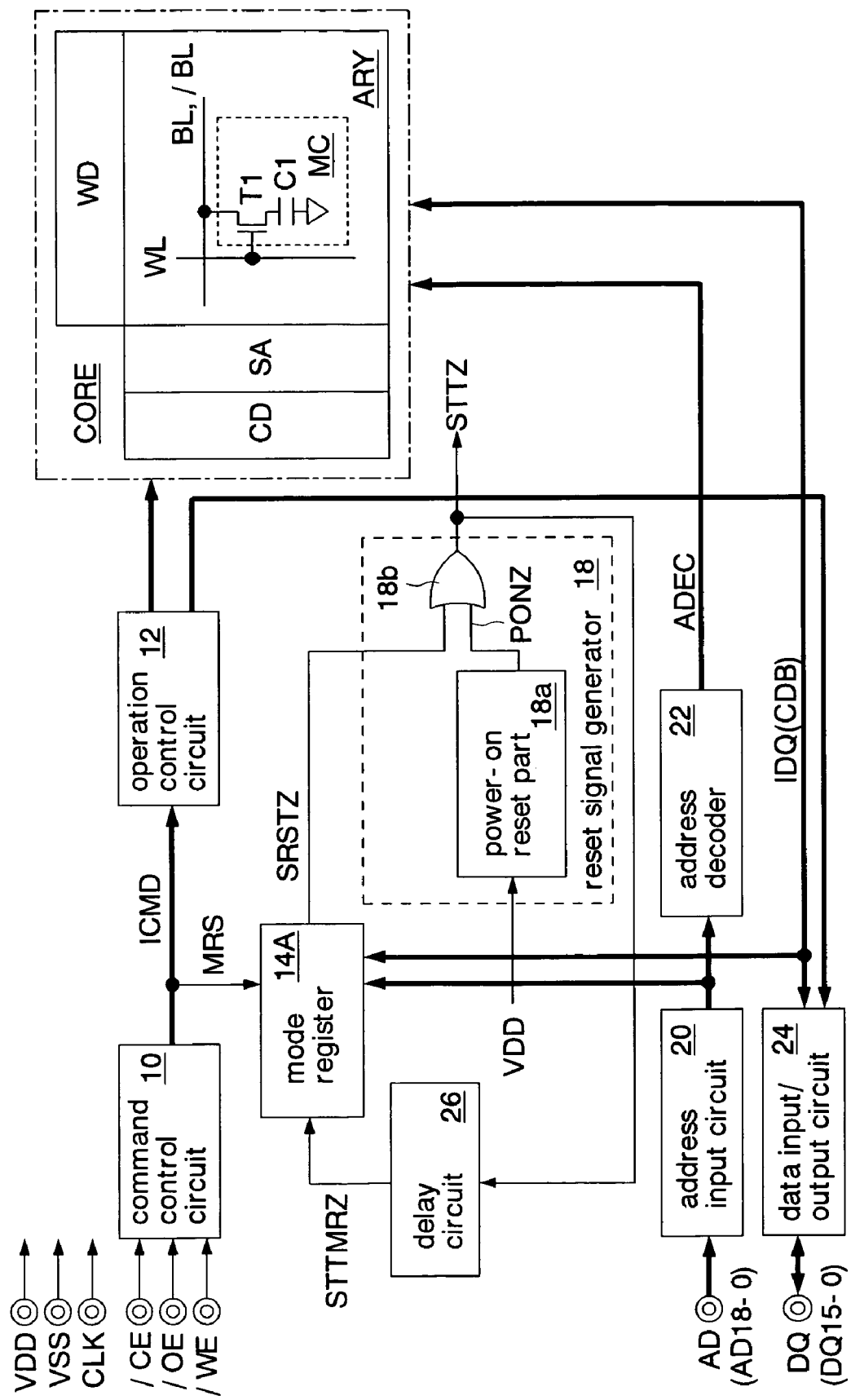
FIG. 5 is a block diagram illustrating a semiconductor memory according to a second embodiment of the present invention.

FIG. 5 illustrates a semiconductor memory according to a second embodiment of the present invention. Like numbers as in the first embodiment refer to like elements, and thus a detailed description thereof will be omitted. In the FCRAM of the present embodiment, a mode register 14A is formed instead of the mode register 14 of the first embodiment. The pulse generator 16 of the first embodiment is eliminated, and a delay circuit 26 is newly formed instead. Other configuration is the same as that in the first embodiment. The soft reset signal SRSTZ output from the mode register 14A is directly supplied to the reset signal generator 18. The delay circuit 26 delays the reset signal STTZ by a predetermined time to generate the mode register reset signal STTMRZ. The mode register reset signal STTMRZ is supplied to the mode register 14A to initialize the mode register 14A. The method of setting the mode register 14 (mode register setting command MRS) is the same as that described in the first embodiment (FIG. 3).

FIG. 6 is a view illustrating details of a mode register 14A shown in FIG. 5. Specifications on the operation setting part (AD18-12) of the mode register 14A (register part) are the same as those described in the first embodiment (FIG. 2). The mode register 14A does not have a dedicated bit (AD11 of FIG. 2, reset setting part) for outputting the soft reset signal SRSTZ, for example. According to the present embodiment, when a combination of operating specifications respectively set by the operation setting parts AD18-16, AD15, and AD14-12 is a restricted combination, the mode register 14A is set to the reset state to output the soft reset signal SRSTZ. Specifically, when the bit AD18-16 indicates a reserve state (KEY=000) and the bit AD15 of the address signal AD supplied together with the mode register setting command MRS indicates a synchronous mode (KEY=0), the mode register 14A outputs the soft reset signal SRSTZ. When the synchronous mode is selected, it is necessary that the burst length be set to one of 8-word, 16-word, and a continuous. When the synchronous mode is selected, the burst length cannot be generally set to the reserve state, and this combination is prohibited. When a bit value that does not generally exist is set, the soft reset signal SRSTZ is output to thereby save the number of bits of the mode register 14A. Specifically, it is not necessary for the bit AD11 to be allocated to the setting bit of the soft reset, so that a circuit size of the mode register 14A is reduced.

Figure 7:
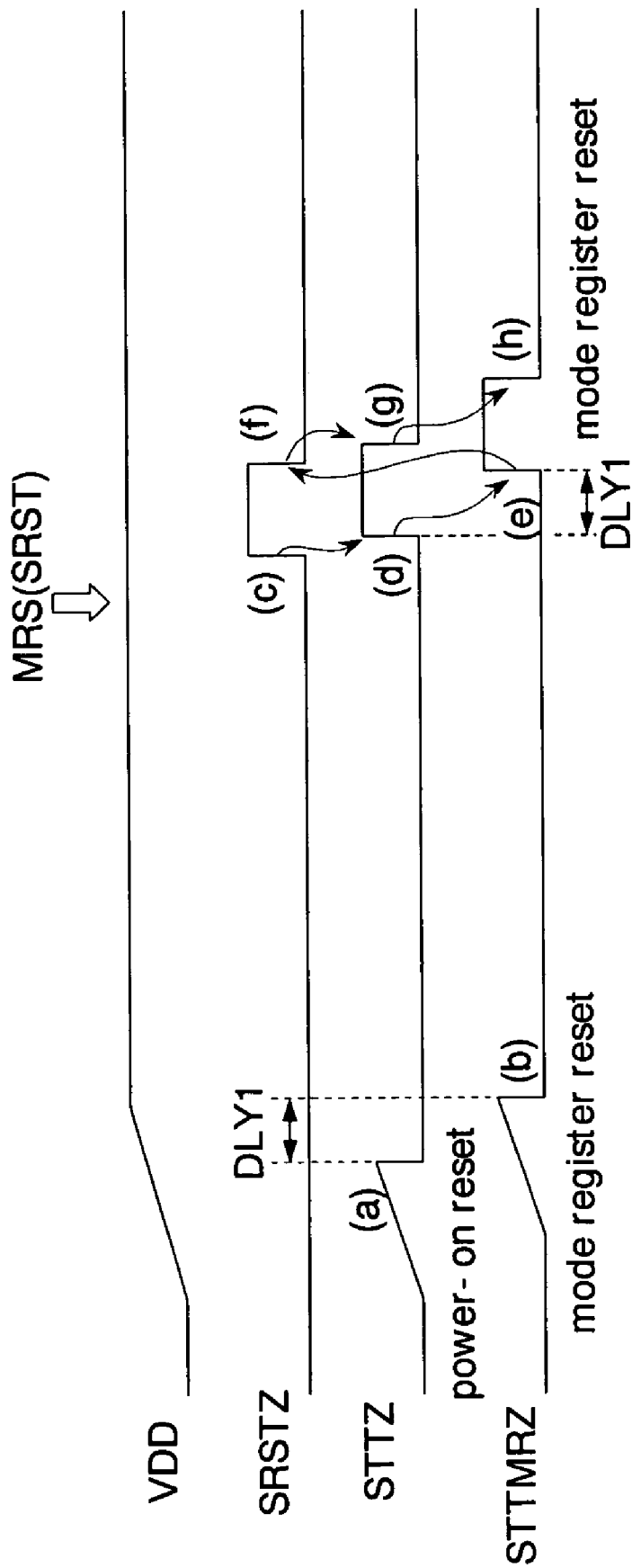
FIG. 7 is a timing chart illustrating operation for generating a reset signal of the semiconductor memory according to the second embodiment.

FIG. 7 illustrates operation for generating the reset signal STTZ. Generation of the reset signal STTZ at the time of power-on of the system is the same as that described in the first embodiment (FIG. 4)((a) in FIG. 7) The mode register reset signal STTMRZ is generated from the reset signal STTM, delayed only by a delay time DLY1 of the delay circuit 26 ((b) in FIG. 7). The mode register 14A is reset by the mode register reset signal STTMRZ, and is reset to a value indicated by '*' in FIG. 6.

The system to access the FCRAM supplies the mode register setting command MRS to the FCRAM in order to investigate a state of the FCRAM in which problems occurred during operation. The mode register 14A changes the reset signal SRSTZ into the high level in response to the mode register setting command MRS ((c) in FIG. 7). The reset signal generator 18 changes the reset signal STTZ into the high level in synchronization with a rising edge of the soft reset signal SRSTZ ((d) in FIG. 7). The delay circuit 26 delays the reset signal STTZ only by the delay time DLY1 to output it as the mode register reset signal STTMRZ ((e) in FIG. 7). The mode register 14A is reset by the mode register reset signal STTMRZ to reset the soft reset signal SRSTZ the low level ((f) in FIG. 7). The reset signal generator 18 changes the reset signal STTZ into the low level in synchronization with a falling edge of the soft reset signal SRSTZ ((g) in FIG. 7). The mode register reset signal STTMRZ delayed only by the delay time from the reset signal is changed into the low level ((h) in FIG. 7). Here, the delay time DLY1 of the delay circuit 26 is designed such that the pulse width of the reset signal STTZ is almost the same as the period P1 of the first embodiment. Namely, the delay time DLY1 is designed such that the reset signal STTZ has the high level period P1 during which the internal circuit can be reliably initialized. In other words, the pulse width of the reset signal STTZ can be easily set by the delay time DLY1 of the delay circuit 26.

The second embodiment may also have the same advantages as in the first embodiment. Moreover, in the present embodiment, an initialization period of the internal circuit by the mode register setting command MRS can be easily set by the delay time DLY1 of the delay circuit 26, so that the internal circuit can be reliably initialized. Since a circuit configuration of the mode register 14A can be reduced, the chip size of the FCRAM can be reduced.

Figure 8:
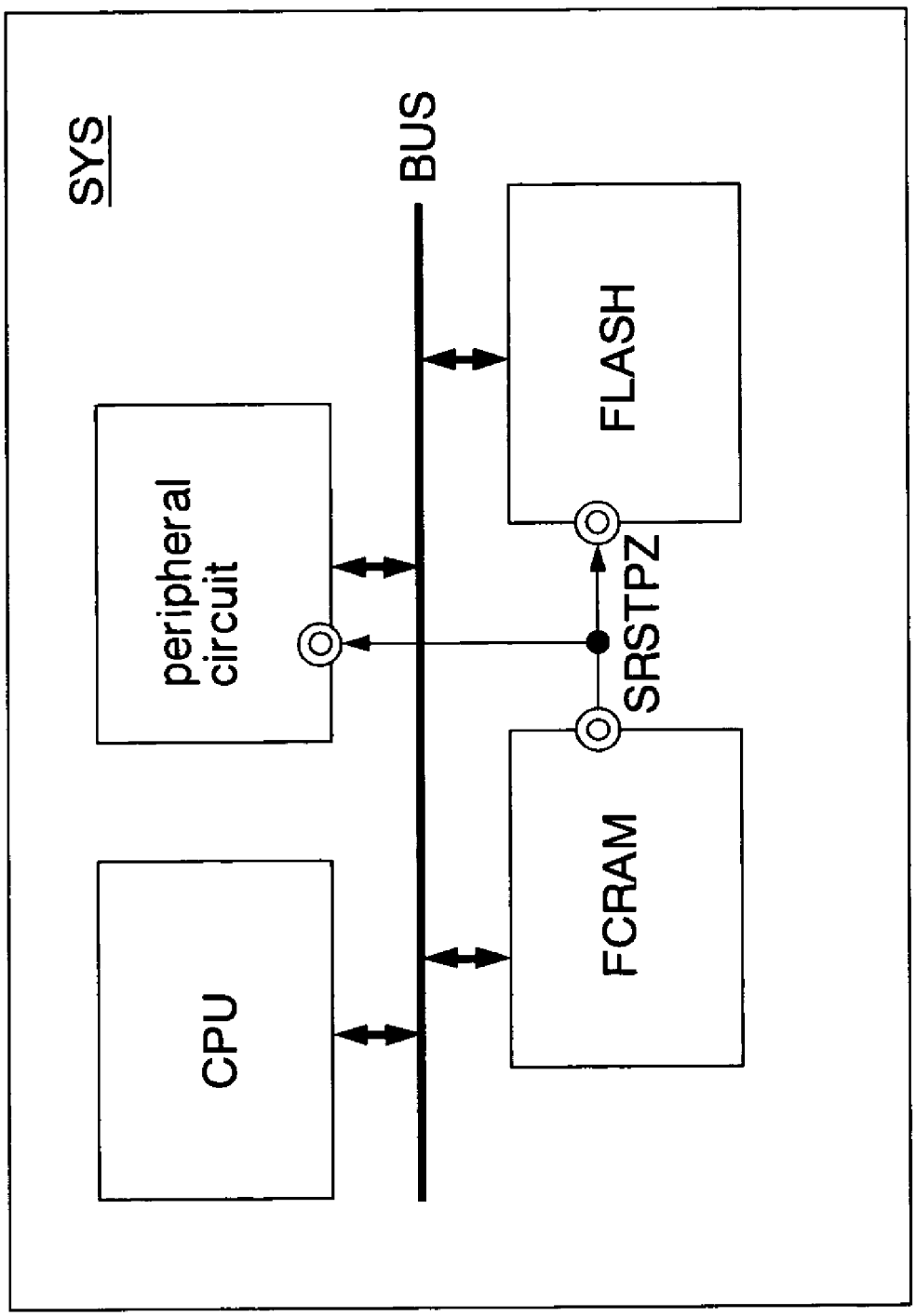
FIG. 8 is a block diagram illustrating a semiconductor memory according to a third embodiment of the present invention, and an exemplary system apparatus according to the present invention.

FIG. 8 illustrates a semiconductor memory according to a third embodiment of the present invention and an exemplary system apparatus according to the present invention. Like numbers as in the first embodiment refer to like elements, and thus a detailed description thereof will be omitted. A system apparatus SYS includes a CPU connected to a system bus BUS, a peripheral circuit such as an I/O interface, a FCRAM, and a flash memory FLASH. For example, the system apparatus SYS is a hand-held terminal such as a cellular phone. The FCRAM is configured such that a reset output terminal that outputs the soft reset pulse signal SRSTPZ is formed in the FCRAM of the first embodiment. Configuration other than the reset output terminal SRSTPZ is the same as that described in the first embodiment.

The CPU controls operations of the peripheral circuit, the FCRAM, and the flash memory. The CPU has a function to supply to the FCRAM the mode register setting command for changing a value of the mode register (reference numeral 14 of FIG. 1) of the FCRAM. In other words, the CPU can reset the internal circuit of the FCRAM by the mode register setting command.

Each of the peripheral circuit and the flash memory has a reset input terminal that receives the soft reset pulse signal SRSTPZ, and an internal circuit such as latches reset by the soft reset pulse signal SRSTPZ. For this reason, the peripheral circuit and the flash memory is reset in synchronization with the reset of the internal circuit of the FCRAM by the mode register setting command. In the present embodiment, when problems occur during operation of the system apparatus SYS, each state of the FCRAM, the peripheral circuit and the flash memory can be easily investigated only by supplying the mode register setting command to the FCRAM by the CPU. In other words, the reset control of the system apparatus SYS can be simply and easily made.

The third embodiment may also have the same advantages as in the first embodiment. Moreover, in the present embodiment, the system apparatus can reset not only the FCRAM but also the peripheral circuit and the flash memory only by supplying the mode register setting command to the FCRAM. Therefore, when problems related to the overall system occur, the cause can be easily investigated.

Further, in the above-mentioned embodiments, examples where the present invention is adapted to the FCRAM have been described. However, the present invention is not limited thereto. For example, the present invention can also be adapted to a semiconductor memory having volatile memory cells such as DRAMs, general pseudo SRAMs, SDRAMs, and SRAMs, or a system LSI that embeds a memory core of these memories.

In the above-mentioned third embodiment, an example where the soft reset pulse signal SRSTPZ is output from the reset output terminal has been described. However, the present invention is not limited thereto. For example, the reset signal STTZ may be output from the reset output terminal.

In the first and second embodiments, examples where each bit of the register part of the mode registers 14 and 14A is set by the external address signal AD have been described. However, the present invention is not limited thereto. For example, the same advantages can be obtained with the external data signal DQ constructed with a number of bits, such as the external address signal AB.

Moreover, the mode register 14A (FIG. 6) of the second embodiment can be applied to the FCRAM of the first embodiment. Also, the mode register 14 (FIG. 2) of the first embodiment can be applied to the FCRAM of the second embodiment. In addition, The FCRAM of the second embodiment can be applied to the FCRAM of the third embodiment.

The invention is not limited to the above embodiments and various modifications may be made without departing from the spirit and scope of the invention. Any improvement may be made in part or all of the components.

What is claimed is:

1. A semiconductor memory comprising:
   a memory cell array;
   a mode register which has a register part including a plurality of operation setting parts in which plural types of operating specifications are respectively set to operate the semiconductor memory, and which outputs a soft reset signal when at least a value of one-bit of said register part represents a reset state;
   an operation control circuit which accesses said memory cell array according to said operating specifications set in said mode register;
   a command control circuit which decodes an external command supplied through a command terminal, and changes a value of said register part when the external command represents a setting command that sets said register part of said mode register;
   a reset signal generator which outputs a reset signal in response to said soft reset signal; and
   an internal circuit reset by said reset signal.

2. The semiconductor memory according to claim 1, further comprising
   a pulse generator which generates a reset pulse signal having a pulse synchronized with a transition edge of said soft reset signal, wherein
   said reset signal generator receives said reset pulse signal as said soft reset signal.

3. The semiconductor memory according to claim 1, wherein
   said mode register initializes said register part in response to said reset signal to stop an output of said soft reset signal.

4. The semiconductor memory according to claim 1, further comprising
   a delay circuit which delays said reset signal to generate a delayed reset signal, wherein
   said mode register initializes said register part in response to said delayed reset signal to stop an output of said soft reset signal.

5. The semiconductor memory according to claim 1, wherein
   said register part of said mode register is set according to at least one of external address signals and external data signals supplied with said setting command.

6. The semiconductor memory according to claim 1, wherein
   said reset signal generator includes:
   a power-on reset part which generates a power-on reset signal when an external power supply voltage is lower than a predetermined value; and
   a synthesis part which outputs said reset signal in response to said power-on reset signal and said soft reset signal.

7. The semiconductor memory according to claim 1, wherein
   said register part of said mode register includes, independently of said operation setting part, a reset setting part whose reset state is set in response to said setting command.

8. The semiconductor memory according to claim 1, wherein
said register part of said mode register is set to said reset state when a combination of operating specifications set by each of the operation setting parts is a restricted combination.

9. The semiconductor memory according to claim 1, further comprising
a reset output terminal which outputs said soft reset signal to outside of the semiconductor memory in order to reset other semiconductor memories mounted on a system apparatus with the semiconductor memory.

10. A system apparatus comprising:
a controller; and
plural types of semiconductor memories accessed by said controller, wherein
one of the semiconductor memories includes
a memory cell array,
a mode register which has a register part including a plurality of operation setting parts in which plural types of operating specifications are respectively set to operate the semiconductor memory, and which outputs a soft reset signal when at least a value of one-bit of said register part represents a reset state,
an operation control circuit which accesses said memory cell array according to said operating specifications set in said mode register,
a command control circuit which decodes an external command supplied through a command terminal, and changes a value of said register part when the external command represents a setting command that sets said register part of said mode register,
a reset signal generator which outputs a reset signal in response to said soft reset signal,
an internal circuit reset by said reset signal, and
a reset output terminal which outputs said soft reset signal to outside of the semiconductor memory, and wherein
at least one of the remaining semiconductor memories includes
a reset input terminal which receives said soft reset signal, and
an internal circuit reset by said soft reset signal.

11. The system apparatus according to claim 10, wherein:
one of the semiconductor memories includes a pulse generator which generates a reset pulse signal in synchronization with a transition edge of said soft reset signal; and
said reset signal generator receives said reset pulse signal as said soft reset signal.

12. The system apparatus according to claim 10, wherein
said mode register initializes said register part in response to said reset signal to stop an output of said soft reset signal.

13. The system apparatus according to claim 10, wherein:
one of the semiconductor memories includes a delay circuit which delays said reset signal to generate a delayed reset signal; and
said mode register initializes said register part in response to said delayed reset signal to stop an output of said soft reset signal.

14. The system apparatus according to claim 10, wherein
said register part of said mode register is set according to at least one of external address signals and external data signals supplied with said setting command.

15. The system apparatus according to claim 10, wherein
said reset signal generator includes:
a power-on reset part which generates a power-on reset signal when an external power supply voltage is lower than a predetermined value; and
a synthesis part which outputs said reset signal in response to said power-on reset signal and said soft reset signal.

16. The system apparatus according to claim 10, wherein
said register part of said mode register includes, independently of said operation setting part, a reset setting part whose reset state is set in response to said setting command.

17. The system apparatus according to claim 10, wherein
said register part of said mode register is set to said reset state when a combination of operating specifications set by each of the operation setting parts is a restricted combination.

* * * * *